(12) United States Patent
Hata

(10) Patent No.: US 6,215,803 B1
(45) Date of Patent: Apr. 10, 2001

(54) GALLIUM NITRIDE GROUP COMPOUND SEMICONDUCTOR LIGHT-EMITTING DEVICE

(75) Inventor: Toshio Hata, Nara (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/070,195

(22) Filed: Apr. 30, 1998

(30) Foreign Application Priority Data

May 21, 1997 (JP) .................................................. 9-131488

(51) Int. Cl.$^7$ ........................................................ H01S 5/00
(52) U.S. Cl. .................................................. 372/46; 372/45
(58) Field of Search ........................... 372/46, 45; 257/77

(56) References Cited

U.S. PATENT DOCUMENTS

| | | | |
|---|---|---|---|
| 5,247,533 | * 9/1993 | Okazaki et al. | 372/45 |
| 5,393,993 | * 2/1995 | Edmond et al. | 257/77 |

FOREIGN PATENT DOCUMENTS

| | | |
|---|---|---|
| 7-235725 | 9/1995 | (JP) . |
| 8-111558 | * 4/1996 | (JP) . |
| 9-116232 | 5/1997 | (JP) . |

OTHER PUBLICATIONS

S. Iwasa et al., Japanese Laid–Open Publication No. 9–246651, Laid open on Sep. 19, 1997 and English abstract thereof.

Y. Oba et al., Japanese Laid–Open Publication No. 62–200786, Laid open on Sep. 4, 1987 and English abstract thereof.

Y. Oba et al., Japanese Laid–Open Publication No. 7–249820, Laid open on Sep. 26, 1995 and English abstract thereof.

H. Tanaka et al., Japanese Laid–Open Publication No. 8–97507, Laid open on Apr. 12, 1996 and English abstract thereof.

* cited by examiner

Primary Examiner—Teresa M. Arroyo
Assistant Examiner—Quyen P. Leung
(74) Attorney, Agent, or Firm—Morrison & Foerster LLP

(57) ABSTRACT

A gallium nitride group compound semiconductor light-emitting device comprising a layered structure on a substrate, the layered structure including: an active layer; a first cladding layer and a second cladding layer with the active layer interposed therebetween, the second cladding layer being located further away from the substrate than the first cladding layer, and having a stripe-shaped projection; a surface protecting layer and an internal current blocking layer which are formed on the second cladding layer and have an opening at a position corresponding to a position on the stripe-shaped projection; and a regrowth layer which covers both the internal current blocking layer and an exposed surface of the second cladding layer to the opening, wherein the surface protecting layer serves to prevent evaporation of Ga, N or impurity elements from the second cladding layer in a process including forming the internal current blocking layer.

15 Claims, 7 Drawing Sheets

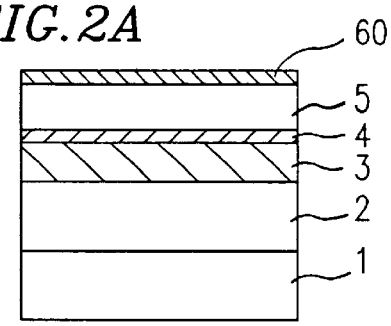
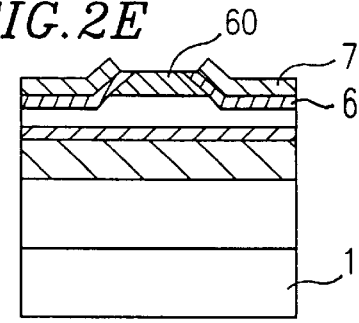
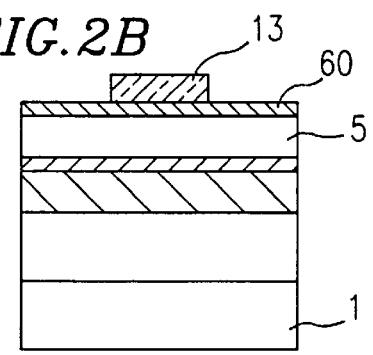
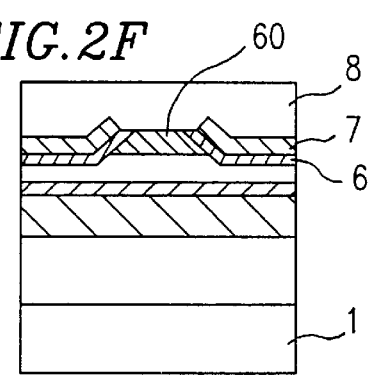
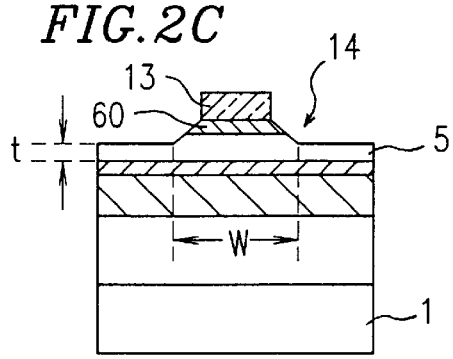
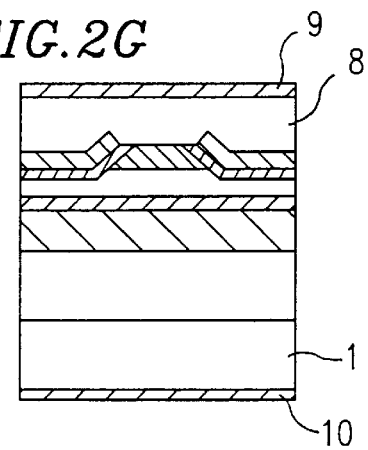
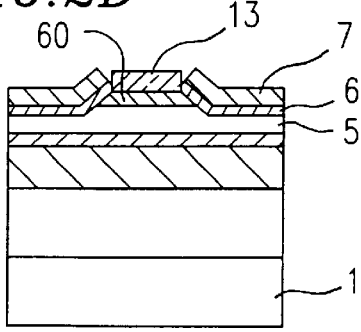

GALLIUM NITRIDE GROUP COMPOUND SEMICONDUCTOR LIGHT-EMITTING DEVICE

BACKGROUND OF THE INVENTION

1. Field of the Invention

The present invention relates to a gallium nitride group compound semiconductor light-emitting device and a method for producing the same. More particularly, the present invention relates to a gallium nitride group compound semiconductor light-emitting device, which is preferable as a gallium nitride group compound semiconductor laser and a gallium nitride group compound semiconductor light-emitting diode, capable of emitting light from the blue region to the ultraviolet region of the spectrum; and a method for producing the same.

2. Description of the Related Art

FIG. 7 shows one example of a conventional compound semiconductor laser device. This compound semiconductor laser device is an InGaAlP group compound semiconductor laser having an internal current blocking layer. Such a semiconductor laser is disclosed in, for example, Japanese Laid-Open Publication No. 62-200786.

The structure of this semiconductor laser will now be described together with a production method thereof. First, an N-type GaAs buffer layer 201, an N-type InGaP buffer layer 202, and an N-type InGaAlP cladding layer 203 are formed in this order on an N-type GaAs substrate 200 in a metal organic chemical vapor deposition (MOCVD) apparatus. Then, an InGaP active layer 204 is formed on the n-type InGaAlP cladding layer 203.

Next, a P-type InGaAlP cladding layer 205 (205a and 205b) including an etching stopper layer 205', a P-type InGaAlP contact layer 206 and a P-type GaAs contact layer 207 are formed on the InGaP active layer 204.

Then, an N-type GaAs current blocking layer 208 and a P-type GaAs contact layer 207 (207a and 207b) are sequentially formed. Thereafter, a P-side electrode 209 and an N-side electrode 210 are formed. In this manner, the InGaAlP group compound semiconductor laser device having a waveguide structure and an internal current blocking layer is completed.

This type of InGaAlP group compound semiconductor laser device has the following problems due to the production method thereof.

More specifically, the method for producing this type of semiconductor laser device requires, during the production process (i.e., after the contact layer 206 has been formed), the steps of taking out the N-type GaAs substrate 200 having semiconductor layers stacked thereon (i.e., wafer) from the MOCVD apparatus; etching the P-type InGaAlP cladding layer 205 by wet etching or dry etching to form a stripe-shaped projection; placing the wafer with a surface of the P-type InGaAlP cladding layer 205 being exposed again in the MOCVD apparatus; and regrowing the N-type GaAs current blocking layer 208 on a portion of the exposed surface of the InGaAlP cladding layer 205. In the regrowth step, a substrate temperature needs to be raised to about 700° C.

As a result, during a rise in the substrate temperature, surface roughness at the exposed surface of the P-type InGaAlP cladding layer 205 is increased. Moreover, the width W of the striped-shaped projection as well as the distance t between the N-type GaAs current blocking layer 208 and the InGaP active layer 204 are changed.

Consequently, in a compound semiconductor laser having such a structure as described above, the crystallinity of the regrown internal current blocking layer is deteriorated. Moreover, both the width W of the stripe-shaped projection and the distance t between the current blocking layer and the active layer are changed, as described above. Thus, electrical and optical characteristics of the semiconductor laser are deteriorated, making the semiconductor laser less reliable.

The above-described problems occur also in a gallium nitride group compound semiconductor light-emitting device.

SUMMARY OF THE INVENTION

According to one aspect of the present invention, a gallium nitride group compound semiconductor light-emitting device including a layered structure on a substrate; the layered structure including: an active layer; a first cladding layer and a second cladding layer with the active layer interposed therebetween, the second cladding layer being located further away from the substrate than the first cladding layer, and having a stripe-shaped projection; a surface protecting layer and an internal current blocking layer which are formed on the second cladding layer and have an opening at a position corresponding to a position on the stripe-shaped projection; and a regrowth layer which covers both the internal current blocking layer and an exposed surface of the second cladding layer to the opening, wherein the surface protecting layer serves to prevent evaporation of Ga, N or impurity elements from the second cladding layer in a process including forming the internal current blocking layer, is provided.

In one embodiment, the substrate is conductive or non-conductive, i.e., not a semiconductor, the surface protecting layer is made of $Al_zGa_{1-z}N$ (where $0 \leq z \leq 1$), and the layered structure is made of $Ga_sAl_tIn_{1-s-t}N$ (where $0 < s \leq 1$, $0 \leq t < 1$, and $0 < s+t \leq 1$).

In one embodiment, the substrate, the first cladding layer, the surface protecting layer and the current blocking layer are of a first conductivity type, the second cladding layer is of a second conductivity type, and the layered structure further includes: a buffer layer of the first conductivity type formed on the substrate, and a contact layer of the second conductivity type formed on the internal current blocking layer of the first conductivity type.

In one embodiment, the substrate is non-conductive, the first cladding layer, the surface protecting layer and the internal current blocking layer are of a first conductivity type, the second cladding layer is of a second conductivity type, and the layered structure further includes: a first buffer layer and a second buffer layer which are formed on the substrate, the second buffer layer being of the first conductivity type; and a contact layer of the second conductivity type formed on the internal current blocking layer of the first conductivity type.

In one embodiment, the surface protecting layer is formed at a temperature in a range from about 400° C. to about 650° C.

According to another aspect of the present invention, a method for producing a gallium nitride group compound semiconductor light-emitting device, comprising the steps of: forming an N-type GaN buffer layer and an N-type $Al_xGa_{1-x}N$ cladding layer on an N-type substrate (where $0 \leq x < 1$); forming an $In_yGa_{1-y}N$ active layer on the N-type $Al_xGa_{1-x}N$ cladding layer (where $0 \leq y \leq 1$; $y \neq 0$ for $x=0$); forming a P-type $Al_xGa_{1-x}N$ cladding layer (where $0 \leq x < 1$) and a P-type $Al_xGa_{1-x}N$ high impurity-concentration layer (where $0 \leq x < 1$) on the $In_yGa_{1-y}N$ active layer; forming an upper part of the P-type $Al_xGa_{1-x}N$ cladding layer and the P-type $Al_xGa_{1-x}N$ high impurity-concentration layer into a stripe-shaped projection; selectively forming an N-type $Al_zGa_{1-z}N$ surface protecting layer (where $0 \leq z \leq 1$) and an N-type $Al_wGa_{1-w}N$ internal current blocking layer (where $0 \leq w \leq 1$) on a part of a surface of the projection; and forming a P-type contact layer on the N-type $Al_wGa_{1-w}N$ internal current blocking layer, wherein the step of forming the N-type $Al_zGa_{1-z}N$ surface protecting layer is performed at a temperature in a first temperature range, the first temperature range being a range in which evaporation of Ga, N or impurity elements is prevented, is provided.

According to still another aspect of the present invention, a method for producing a gallium nitride group compound semiconductor light-emitting device, comprising the steps of: forming a P-type GaN buffer layer and a P-type $Al_xGa_{1-x}N$ cladding layer on a P-type substrate (where $0 \leq x < 1$); forming an $In_yGa_{1-y}N$ active layer on the P-type $Al_xGa_{1-x}N$ cladding layer (where $0 \leq y \leq 1$; $y \neq 0$ for $x=0$); forming an N-type $Al_xGa_{1-x}N$ cladding layer (where $0 \leq x < 1$) and an N-type $Al_xGa_{1-x}N$ high impurity-concentration layer (where $0 \leq x < 1$) on the $In_yGa_{1-y}N$ active layer; forming an upper part of the N-type $Al_xGa_{1-x}N$ cladding layer and the N-type $Al_xGa_{1-x}N$ high impurity-concentration layer into a stripe-shaped projection; selectively forming a P-type $Al_zGa_{1-z}N$ surface protecting layer (where $0 \leq z \leq 1$) and a P-type $Al_wGa_{1-w}N$ internal current blocking layer (where $0 \leq w \leq 1$) on a part of a surface of the projection of the N-type $Al_xGa_{1-x}N$ cladding layer; and forming an N-type GaN contact layer on the P-type $Al_wGa_{1-w}N$ internal current blocking layer, wherein the step of forming the P-type $Al_zGa_{1-z}N$ surface protecting layer is performed at a temperature in a first temperature range, the first temperature range being a range in which evaporation of Ga, N or impurity elements is prevented, is provided.

According to yet another aspect of the present invention, a method for producing a gallium nitride group compound semiconductor light-emitting device, comprising the steps of: forming a first $Al_dGa_{1-d}N$ buffer layer (where $0 < d < 1$), a second N-type GaN buffer layer and an N-type $Al_xGa_{1-x}N$ cladding layer (where $0 \leq x < 1$) on a non-conductive substrate; forming an $In_yGa_{1-y}N$ active layer on the N-type $Al_xGa_{1-x}N$ cladding layer (where $0 \leq y \leq 1$; $y \neq 0$ for $x=0$); forming a P-type $Al_xGa_{1-x}N$ cladding layer (where $0 \leq x < 1$) and a P-type $Al_xGa_{1-x}N$ high impurity-concentration layer (where $0 \leq x < 1$) on the $In_yGa_{1-y}N$ active layer; forming an upper part of the P-type $Al_xGa_{1-x}N$ cladding layer and the P-type $Al_xGa_{1-x}N$ high impurity-concentration layer into a stripe-shaped projection; selectively forming an N-type $Al_zGa_{1-z}N$ surface protecting layer (where $0 \leq z \leq 1$) and an N-type $Al_wGa_{1-w}N$ internal current blocking layer (where $0 \leq w \leq 1$) on a part of a surface of the projection of the P-type $Al_xGa_{1-x}N$ cladding layer; and forming a P-type GaN contact layer on the N-type $Al_wGa_{1-w}N$ internal current blocking layer (where $0 \leq w \leq 1$), wherein the step of forming the N-type $Al_zGa_{1-z}N$ surface protecting layer is performed at a temperature in a first temperature range, the first temperature range being a range in which evaporation of Ga, N or impurity elements is prevented, is provided.

According to yet another aspect of the present invention, a method for producing a gallium nitride group compound semiconductor light-emitting device, comprising the steps of: forming a first $Al_dGa_{1-d}N$ buffer layer (where $0 < d < 1$), a second P-type GaN buffer layer and a P-type $Al_xGa_{1-x}N$ cladding layer (where $0 \leq x < 1$) on a non-conductive substrate; forming an $In_yGa_{1-y}N$ active layer on the P-type $Al_xGa_{1-x}N$ cladding layer (where $0 \leq y \leq 1$; $y \neq 0$ for $x=0$); forming an N-type $Al_xGa_{1-x}N$ cladding layer (where $0 \leq x < 1$) and an N-type $Al_xGa_{1-x}N$ high impurity-concentration layer (where $0 \leq x < 1$) on the $In_yGa_{1-y}N$ active layer; forming an upper part of the N-type $Al_xGa_{1-x}N$ cladding layer and the N-type $Al_xGa_{1-x}N$ high impurity-concentration layer into a stripe-shaped projection; selectively forming a P-type $Al_zGa_{1-z}N$ surface protecting layer (where $0 \leq z \leq 1$) and a P-type $Al_wGa_{1-w}N$ internal current blocking layer (where $0 \leq w \leq 1$) on a part of a surface of the projection of the N-type $Al_xGa_{1-x}N$ cladding layer; and forming an N-type GaN contact layer on the P-type $Al_wGa_{1-w}N$ internal current blocking layer (where $0 \leq w \leq 1$), wherein the step of forming the P-type $Al_zGa_{1-z}N$ surface protecting layer is performed at a temperature in a first temperature range, the first temperature range being a range in which evaporation of Ga, N or impurity elements is prevented, is provided.

In one embodiment, the first temperature range is about 400° C. to about 650° C.

Functions of the present invention will now be described.

According to the present invention, a surface protecting layer is formed on an exposed surface of a cladding layer having a projection, at a low temperature range of about 400° C. to about 650° C. Then, the substrate temperature is raised to about 1050° C., and a (internal) current blocking layer is formed.

Therefore, evaporation of Ga, N or impurity elements can be prevented. As a result, the surface roughness at the exposed surface of the cladding layer will not occur. Moreover, the width W of the stripe-shaped projection as well as the distance t between the internal current blocking layer and an active layer will not change.

The surface protecting layer formed at a low substrate temperature of about 400° C. to about 650° C. is in a polycrystalline state. However, during the step of raising the substrate temperature to cause regrowth of the current blocking layer on a surface of the surface protecting layer, the surface protecting layer transforms from the polycrystalline state to the single crystalline state. Thus, there are no significant adverse effects on the crystallinity of the current blocking layer.

As described above, the surface protecting layer is formed on the exposed surface of the cladding layer having a projection. As a result, the surface roughness at the exposed surface of the cladding layer to the ambient atmosphere will not occur. Moreover, the width W in the stripe-shaped projection as well as the distance t between the current blocking layer and the active layer will not change. Accordingly, a highly-reliable gallium nitride group semiconductor light-emitting device having a high-quality regrowth interface as well as having excellent electrical and optical characteristics can be realized.

Thus, the invention described herein makes possible the advantage of providing a highly-reliable gallium nitride group compound semiconductor light-emitting device which has a high-quality regrowth interface as well as having excellent electrical and optical characteristics; and a method for producing the same.

This and other advantages of the present invention will become apparent to those skilled in the art upon reading and understanding the following detailed description with reference to the accompanying figures.

BRIEF DESCRIPTION OF THE DRAWINGS

FIGS. 2A through 2G are diagrams illustrating production steps of the gallium nitride group compound semiconductor laser of FIG. 1 according to Example 1 of the present invention.

DESCRIPTION OF THE PREFERRED EMBODIMENTS

Hereinafter, the present invention will be described in detail by way of illustrative examples with reference to the accompanying drawings. It should be noted that, in this specification, a gallium nitride group compound semiconductor includes, for example, $Ga_sAl_tIn_{1-s-t}N$ (where $0<s\leq1$, $0\leq t<1$ and $0<s+t\leq1$).

EXAMPLE 1

Figure 1:
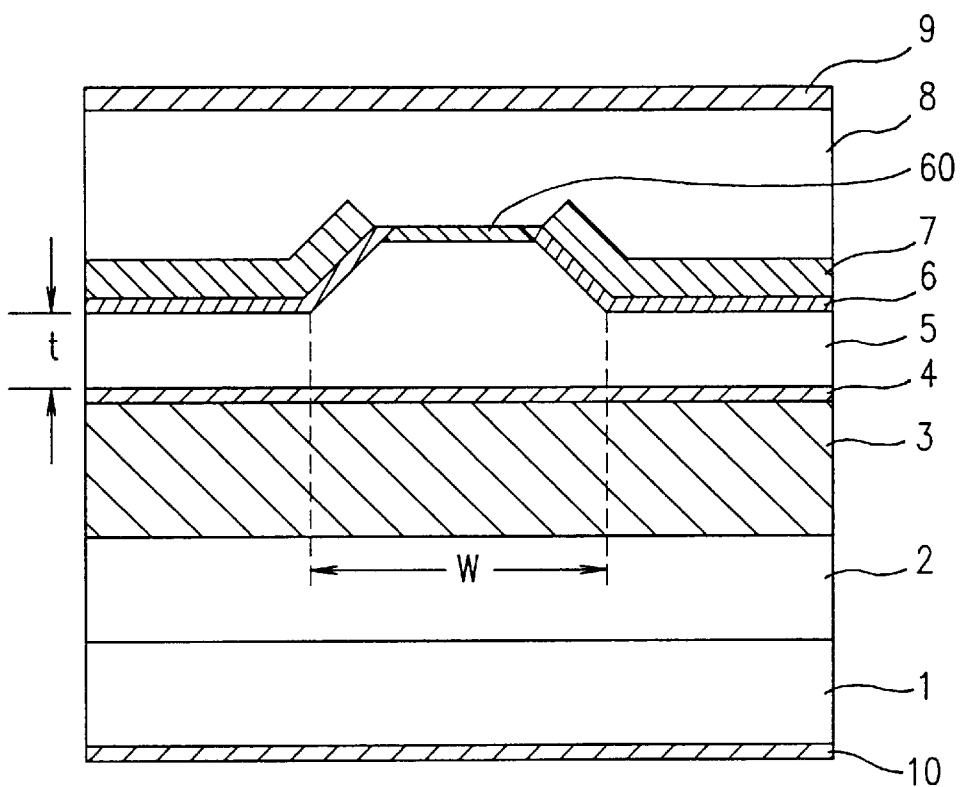
FIG. 1 is a cross sectional view showing a gallium nitride group compound semiconductor laser according to Example 1 of the present invention.

FIG. 1 shows Example 1 of a gallium nitride group compound semiconductor light-emitting device of the present invention. FIGS. 2A through 2G show production steps thereof. In Example 1, the present invention is applied to a gallium nitride group compound semiconductor laser.

The gallium nitride group compound semiconductor laser of Example 1 is produced using a metal organic chemical vapor deposition (MOCVD) method. An N-type SiC substrate is used as a substrate. As a group V material, ammonia ($NH_3$) is preferably used, and as group III materials, trimethyl gallium (TMG), trimethyl aluminum (TMA) and trimethyl indium (TMI) are preferably used. As a P-type impurity element and an N-type impurity element, biscyclopentadienylmagnesium ($Cp_2Mg$) and monosilane ($SiH_4$) are preferably employed, respectively. $H_2$ and $N_2$ are preferably used as carrier gases.

Hereinafter, the structure of the gallium nitride group compound semiconductor laser of Example 1 will be described together with the production steps thereof, with reference to FIGS. 2A through 2G. First of all, in order to perform a first crystal growth, an N-type SiC substrate (wafer) 1 is placed on a susceptor of an MOCVD apparatus (not shown). Next, a temperature of the N-type SiC substrate 1 is raised to about 1200° C. and surface treatment is conducted. Then, the temperature of the N-type SiC substrate 1 is lowered to a temperature between about 500° C. and about 650° C. Thereafter, an N-type GaN buffer layer 2 with a thickness of about 10 nm to about 4000 nm is grown on the N-type SiC substrate 1.

Next, the substrate temperature is raised to about 1050° C., and an N-type $Al_{0.1}Ga_{0.9}N$ cladding layer 3 with a thickness of about 0.1 µm to about 0.3 µm is grown on the N-type GaN buffer layer 2. Thereafter, the substrate temperature is lowered to a temperature between about 800° C. and about 850° C. Then, a non-doped $In_{0.32}Ga_{0.68}N$ active layer 4 with a thickness of about 3 nm to about 80 nm is grown on the N-type $Al_{0.1}Ga_{0.9}N$ cladding layer 3.

Thereafter, the substrate temperature is raised to about 1050° C., and an Mg-doped $Al_{0.1}Ga_{0.9}N$ cladding layer 5 with a thickness of about 0.1 µm to 0.3 µm is grown on the non-doped $In_{0.32}Ga_{0.68}N$ active layer 4. Then, a highly Mg-doped $Al_{0.05}Ga_{0.95}N$ layer 60 with a thickness of about 50 nm to 200 nm is grown on the Mg-doped $Al_{0.1}Ga_{0.9}N$ cladding layer 5 (see FIG. 2A).

Next, the resultant wafer is removed from a growth chamber in the MOCVD apparatus. An insulation film 13 of, for example, $SiO_x$ or $SiN_x$ is formed on the highly Mg-doped $Al_{0.05}Ga_{0.95}N$ layer 60. Thereafter, using a normal photolithography technique, a part of the insulation film 13 is removed so as to form a stripe-shape (see FIG. 2B).

Next, the wafer is treated with wet etching or dry etching. Thus, the highly Mg-doped $Al_{0.05}Ga_{0.95}N$ layer 60 and the Mg-doped $Al_{0.1}Ga_{0.9}N$ cladding layer 5 are partially etched away so as to form a stripe-shaped projection 14 (see FIG. 2C).

This etching is conducted so that the width W of the stripe-shaped projection is in the range from about 2 µm to about 4 µm, and that the distance t between a current blocking layer 7, which will be described later, and the $In_{0.32}Ga_{0.68}N$ active layer 4 (more specifically, the distance t between an N-type $Al_{0.05}Ga_{0.95}N$ surface protecting layer 6, which will be described later, and the $In_{0.32}Ga_{0.68}N$ active layer 4) is about 0.1 µm.

Then, the wafer is again placed on the susceptor of the MOCVD apparatus for a second crystal growth.

In this growth step, the substrate temperature is first set to a temperature between about 400° C. and about 650° C. Then, an N-type $Al_{0.05}Ga_{0.95}N$ surface protecting layer 6 with a thickness of about 20 nm to about 100 nm is formed on an exposed surface of the Mg-doped $Al_{0.1}Ga_{0.9}N$ cladding layer 5. Thereafter, the surface temperature is raised to about 1050° C., and an N-type $Al_{0.15}Ga_{0.85}N$ current blocking layer (internal current blocking layer) 7 is selectively grown so as to have a thickness of about 0.5 µm to about 1 µm (see FIG. 2D).

Prior to the step of applying the layer 7, the N-type $Al_{0.05}Ga_{0.95}N$ surface protecting layer 6 grown at a low substrate temperature is in a polycrystalline state. However, during the step of raising the substrate temperature to cause regrowth of the current blocking layer 7 on the surface of the surface protecting layer 6, the surface protecting layer 6 transforms from the polycrystalline state to the single crystalline state. Thus, there are no significant adverse effects on the crystallinity of the N-type current blocking layer 7.

Then, the wafer is again removed from the growth chamber of the MOCVD apparatus, and the insulation film 13 of, for example, $SiO_x$ or $SiN_x$ is etched away using a hydrofluoric acid etching solution (see FIG. 2E).

Thereafter, the wafer is again placed on the susceptor of the MOCVD apparatus for a third crystal growth.

In this growth step, the substrate temperature is first raised to about 1050° C. Then, an Mg-doped GaN contact layer 8 with a thickness of about 0.5 µm to about 1 µm is grown so as to cover the N-type current blocking layer 7 and the like (see FIG. 2F).

Thereafter, the wafer is removed from the MOCVD apparatus. In a $N_2$ atmosphere, the wafer is annealed at a temperature of about 800° C. so that the Mg-doped layers are transformed to P-type. Then, a P-side electrode 9 is formed on the P-type GaN contact layer 8, and an N-side electrode 10 is formed on a bottom surface of the N-type SiC substrate 1 (see FIG. 2G).

In the above-described manner, the gallium nitride group compound semiconductor laser having the cross-sectional structure shown in FIG. 1 is completed.

According to the gallium nitride group compound semiconductor laser of Example 1, the surface protecting layer 6 is formed on the exposed surface of the cladding layer 5 which has a projection formed by etching. Therefore, Ga, N or impurity elements within the cladding layer 5 will not evaporate during a rise in the substrate temperature for regrowth of the current blocking layer 7. As a result, the following problems can be prevented from occurring during such a rise in the substrate temperature: (1) an increase in surface roughness of the exposed surface of the cladding layer 5 having a projection 14; (2) a change in the width W of the stripe-shaped projection; and (3) a change in the distance t between the current blocking layer 7 and the active layer 4.

Thus, according to Example 1 of the present invention, an internal current blocking-type gallium nitride group compound semiconductor laser having a high-quality regrowth interface and a highly-reliable waveguide structure, as well as having excellent electrical and optical characteristics can be realized.

EXAMPLE 2

FIGS. 3A to 3G show production steps of a gallium nitride group compound semiconductor light-emitting device according to Example 2 of the present invention. In Example 2, the present invention is applied to a gallium nitride group compound semiconductor laser, as in the case of Example 1.

Example 2 also uses an MOCVD method. Regarding a group V material, group III materials, a P-type impurity element, an N-type impurity element and carrier gases, the same materials as those in Example 1 are used in Example 2.

Hereinafter, the production steps of the gallium nitride group compound semiconductor laser according to Example 2 of the present invention are described with reference to FIGS. 3A to 3G.

First, in order to perform a first crystal growth, a P-type SiC substrate 11 is placed on a susceptor of an MOCVD apparatus. Next, the substrate temperature is raised to about 1200° C., and surface treatment is conducted. Then, the temperature of the P-type SiC substrate 11 is lowered to a temperature between about 500° C. and about 650° C. Thereafter, an Mg-doped GaN buffer layer 22 with a thickness of about 10 nm to about 4000 nm is grown on the P-type SiC substrate 11. Then, the substrate temperature is raised to about 1050° C., and an Mg-doped $Al_{0.1}Ga_{0.9}N$ cladding layer 33 with a thickness of about 0.1 $\mu$m to about 0.3 $\mu$m is grown on the Mg-doped GaN buffer layer 22.

Then, the substrate temperature is lowered to about 800° C. to about 850° C., and a non-doped $In_{0.32}Ga_{0.68}N$ active layer 4 with a thickness of about 3 nm to about 80 nm is grown on the cladding layer 33. Next, the substrate temperature is raised to about 1050° C., and an N-type $Al_{0.1}Ga_{0.9}N$ cladding layer 55 with a thickness of about 0.1 $\mu$m to about 0.3 $\mu$m is grown on the active layer 4. Then, a highly-doped N-type $Al_{0.05}Ga_{0.95}N$ layer 60' with a thickness of about 50 nm to about 200 nm is grown on the cladding layer 55 (see FIG. 3A).

Next, the resultant wafer is removed from a growth chamber in the MOCVD apparatus. An insulation film 13 of, for example, $SiO_x$ or $SiN_x$, is formed on the highly-doped N-type $Al_{0.05}Ga_{0.95}N$ layer 60'. Then, using a common photolithography technique, a part of the insulation film 13 on the highly-doped N-type $Al_{0.05}Ga_{0.95}N$ layer 60' is removed so as to form a stripe-shape 14 (see FIG. 3B).

Next, the wafer is treated with wet etching or dry etching. Thus, the N-type $Al_{0.05}Ga_{0.95}N$ layer 60' and the N-type $Al_{0.1}Ga_{0.9}N$ cladding layer 55 are partially etched away so as to form a stripe-shaped projection 14 (see FIG. 3C).

This etching is conducted so that the width W of the stripe-shaped projection is in the range from about 2 $\mu$m to about 4 $\mu$m, and that the distance t between a current blocking layer 77, which will be described later, and the active layer 4 is about 0.1 $\mu$m.

Then, the wafer is again placed on the susceptor of the MOCVD apparatus for a second crystal growth.

In this growth step, an Mg-doped $Al_{0.05}Ga_{0.95}N$ surface protecting layer 66 is grown at a substrate temperature of about 400° C. to about 650° C. so as to have a thickness of about 20 nm to about 100 nm. Then, the substrate temperature is raised to about 1050° C., and an Mg-doped $Al_{0.15}Ga_{0.85}N$ current blocking layer 77 is selectively grown so as to have a thickness of about 0.5 $\mu$m to about 1 $\mu$m (see FIG. 3D).

Prior to the step of applying the current blocking layer 77, the surface protecting layer 66 formed at a low substrate temperature is in a polycrystalline state. However, during the step of raising the substrate temperature to cause regrowth of the Mg-doped $Al_{0.15}Ga_{0.85}N$ current blocking layer 77 on the surface of the surface protecting layer 66, the surface protecting layer 66 transforms from the polycrystalline state to the single crystalline state, as in the case of Example 1. Thus, there are no significant adverse effects on the crystallinity of the Mg-doped $Al_{0.15}Ga_{0.85}N$ current blocking layer 77.

Figure 3A:
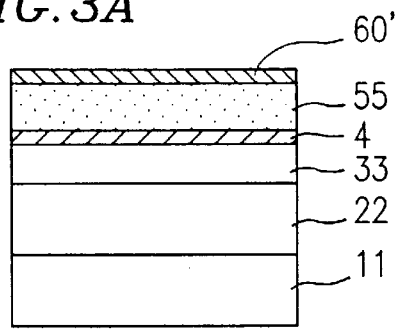
FIGS. 3A through 3G are diagrams illustrating production steps of a gallium nitride group compound semiconductor laser according to Example 2 of the present invention.
Figure 3B:
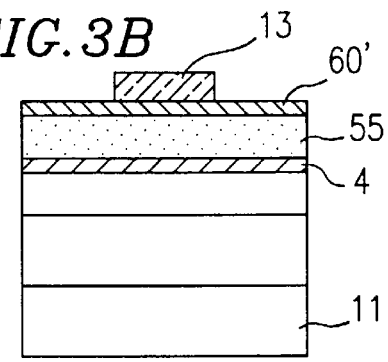
Figure 3C:
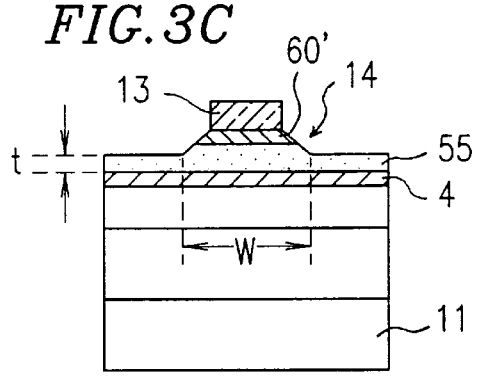
Figure 3D:
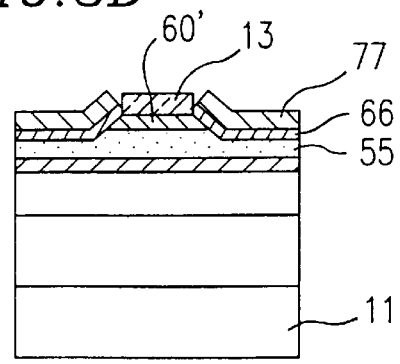
Figure 3E:
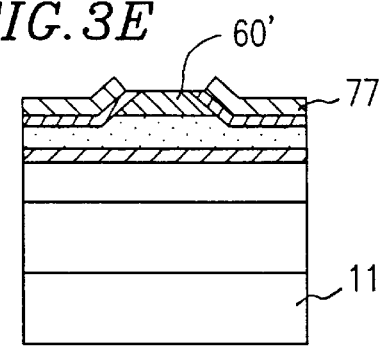

Next, the wafer is removed from the growth chamber of the MOCVD apparatus, and the insulation film 13 is etched away by a hydrofluoric acid etching solution (see FIG. 3E).

Thereafter, the wafer is again placed on the susceptor of the MOCVD apparatus for a third crystal growth.

Figure 3F:
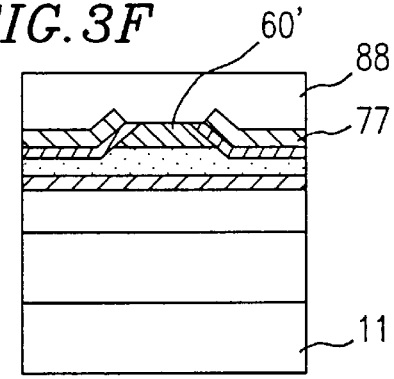
Figure 3G:
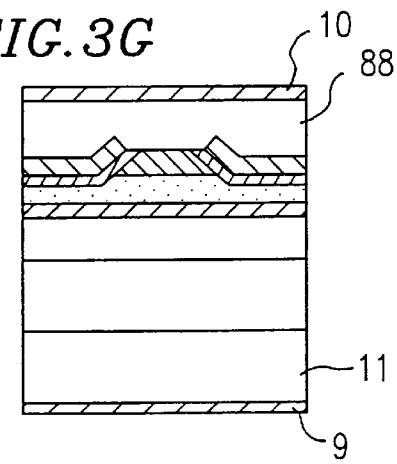

In this growth step, the substrate temperature is raised to about 1050° C., and an N-type GaN contact layer 88 is grown so as to have a thickness of about 0.5 $\mu$m to about 1 $\mu$m (see FIG. 3F).

Then, the wafer is removed from the MOCVD apparatus. Next, in a $N_2$ atmosphere, the wafer is annealed at a temperature of about 800° C. so that the Mg-doped layers are transformed to P-type. Then, an N-side electrode 10 is formed on the N-type GaN contact layer 88, and a P-side electrode 9 is formed on a bottom surface of the P-type SiC substrate 11 (see FIG. 3G). In the above-described manner, the gallium nitride group compound semiconductor laser according to Example 2 is completed.

As in the case of Example 1, the gallium nitride group compound semiconductor laser of Example 2 also includes a surface protecting layer formed on the exposed surface of the cladding layer having a projection. Therefore, the gallium nitride group compound semiconductor laser having the same effects as those in Example 1 can be realized.

EXAMPLE 3

Figure 4:
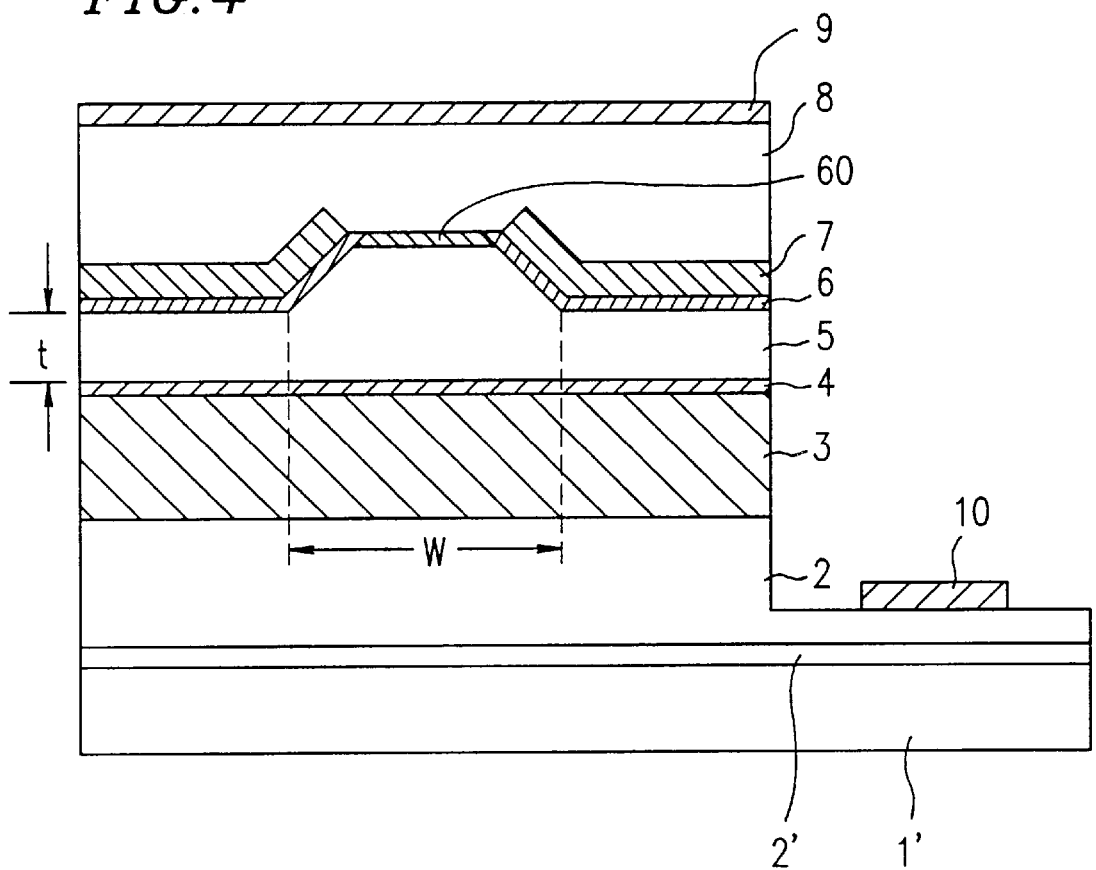
FIG. 4 is a cross sectional view showing a gallium nitride group compound semiconductor laser according to Example 3 of the present invention.

FIG. 4 shows a gallium nitride group compound semiconductor light-emitting device according to Example 3 of the present invention. FIGS. 5A to 5H show the production steps thereof. In Example 3, the present invention is applied to a gallium nitride group compound semiconductor laser, as in the case of Examples 1 and 2. However, the gallium nitride group compound semiconductor laser of Example 3 is different from those of Examples 1 and 2 in that a sapphire substrate 1' is used as a substrate and an N-side electrode 10 is formed on an N-type GaN layer 2 in the gallium nitride group compound semiconductor laser of Example 3.

The gallium nitride group compound semiconductor laser of Example 3 is also produced by an MOCVD method. Regarding a group V material, group III materials, a P-type impurity element, an N-type impurity element and carrier gases, the same materials as those in Examples 1 and 2 are used.

Hereinafter, the production steps of the gallium nitride group compound semiconductor laser of Example 3 will be described with reference to FIGS. 5A to 5H.

First of all, in order to perform a first crystal growth, a sapphire substrate 1' is placed on a susceptor of an MOCVD apparatus. Next, the substrate temperature is raised to about 1200° C. and surface treatment is conducted. Next, the temperature of the sapphire substrate 1' is lowered to a temperature between about 400° C. to about 650° C. Thereafter, an $Al_{0.05}Ga_{0.95}N$ buffer layer 2' with a thickness of about 20 nm to about 100 nm is grown on a surface of the sapphire substrate 1'.

Then, the substrate temperature is raised to about 1050° C., and an N-type GaN layer 2 with a thickness of about 0.5 $\mu$m to about 4 $\mu$m is grown on the buffer layer 2'. Thereafter, at the substrate temperature of about 1050° C., an N-type $Al_{0.1}Ga_{0.9}N$ cladding layer 3 with a thickness of about 0.1 $\mu$m to about 0.3 $\mu$m is grown on the N-type GaN layer 2. Then, the substrate temperature is lowered to about 800° C. to about 850° C., and a non-doped $In_{0.32}Ga_{0.68}N$ active layer 4 with a thickness of about 3 nm to about 80 nm is grown on the cladding layer 3.

Then, the substrate temperature is raised to about 1050° C., and an Mg-doped $Al_{0.1}Ga_{0.9}N$ cladding layer 5 with a thickness of about 0.1 $\mu$m to about 0.3 $\mu$m is grown on the active layer 4. Thereafter, the a highly Mg-doped $Al_{0.05}Ga_{0.95}N$ layer 60 is grown thereon so as to have a thickness of 50 nm to 200 nm (see FIG. 5A).

Next, the resultant wafer is removed out from a growth chamber in the MOCVD apparatus. Then, an insulation film 13 of, for example, $SiO_x$ or $SiN_x$, is formed on the highly Mg-doped $Al_{0.05}Ga_{0.95}N$ layer 60. Thereafter, using a common photolithography technique, a part of the insulation film 13 is removed so as to form a stripe-shape (see FIG. 5B).

Then, the wafer is treated with wet etching or dry etching. Thus, the Mg-doped $Al_{0.05}Ga_{0.95}N$ layer 60 and the Mg-doped $Al_{0.1}Ga_{0.9}N$ cladding layer 5 are partially etched away so as to form a stripe-shaped projection 14 (see FIG. 5C).

This etching is conducted so that the width W of the stripe-shaped projection is in the range from about 2 $\mu$m to about 4 $\mu$m, and that the distance t between a current blocking layer 7, which will be described later, and the active layer 4 is about 0.1 $\mu$m.

Then, the wafer is again placed on the susceptor of the MOCVD apparatus for a second crystal growth.

In this growth step, an N-type $Al_{0.05}Ga_{0.95}N$ surface protecting layer 6 is grown at a substrate temperature of about 400° C. to about 650° C. so as to have a thickness of about 20 nm to about 100 nm. Then, the substrate temperature is raised to about 1050° C., and an N-type $Al_{0.15}Ga_{0.85}N$ current blocking layer 7 is selectively grown so as to have a thickness of about 0.5 $\mu$m to about 1 $\mu$m (see FIG. 5D).

Prior to the step of applying the current blocking layer 7, the surface protecting layer 6 formed at a low substrate temperature is in a polycrystalline state. However, during the step of raising the substrate temperature to cause regrowth of the current blocking layer 7 on the surface protecting layer 6, the surface protecting layer 6 transforms from the polycrystalline state to the single crystalline state, as in the case of Examples 1 and 2. Thus, there are no significant adverse effects on the crystallinity.

Figure 5A:
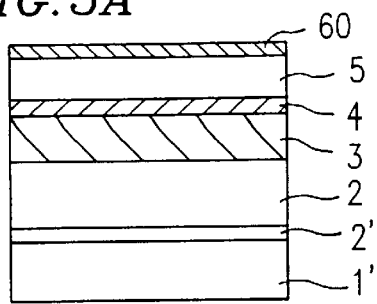
FIGS. 5A through 5H are diagrams illustrating production steps of the gallium nitride group compound semiconductor laser of FIG. 4 according to Example 3 of the present invention.
Figure 5B:
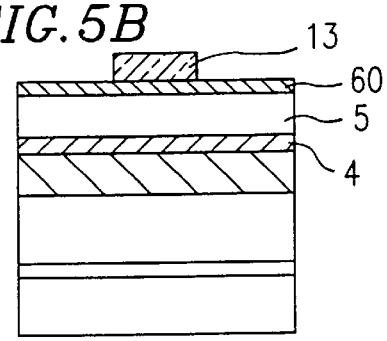
Figure 5C:
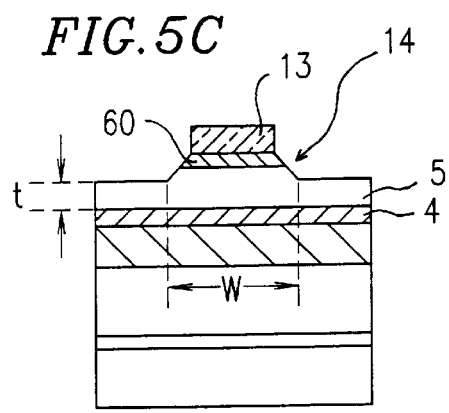
Figure 5D:
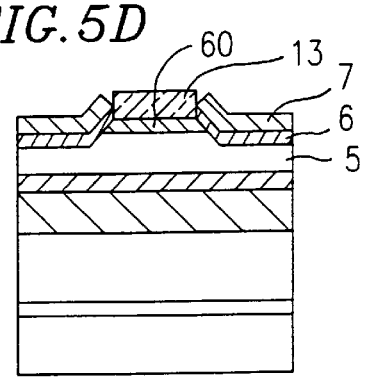
Figure 5E:
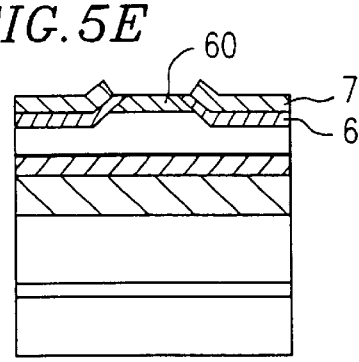

Subsequently, the wafer is removed from the growth chamber in the MOCVD apparatus, and the insulation film 13 is etched away by a hydrofluoric acid etching solution (see FIG. 5E).

Next, the wafer is again placed on the susceptor of the MOCVD apparatus for a third crystal growth.

Figure 5F:
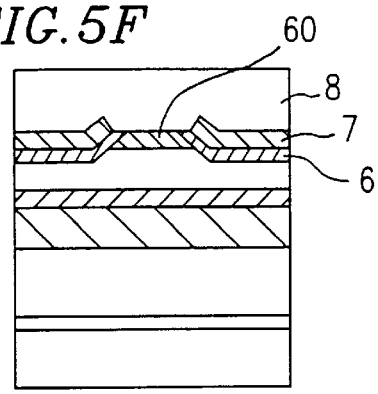

In this growth step, the substrate temperature is first raised to about 1050° C., and an Mg-doped GaN contact layer 8 is grown so as to have a thickness of about 0.5 $\mu$m to about 1 $\mu$m (see FIG. 5F).

Figure 5G:
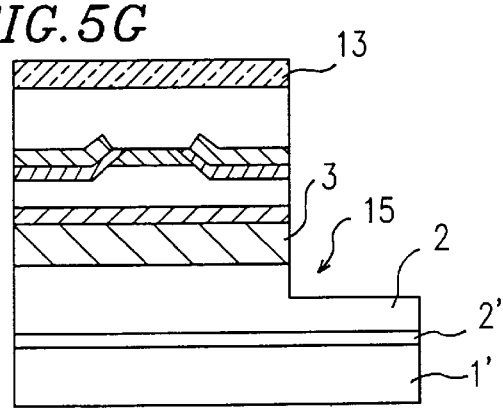
Figure 5H:
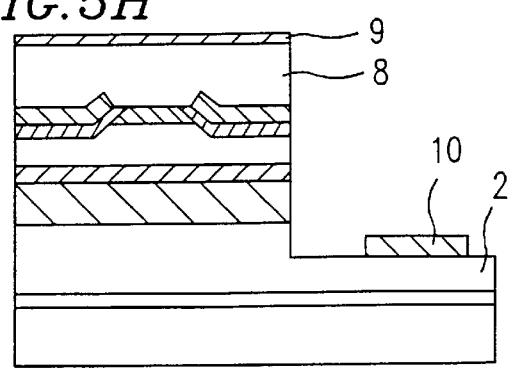

Then, the wafer is removed from the MOCVD apparatus, and is etched until the N-type GaN layer 2 is exposed as shown by the reference numeral 15 in FIG. 5G.

Thereafter, the wafer is removed from the MOCVD apparatus. In a $N_2$ atmosphere, the wafer is annealed at a temperature of about 800° C. so that the Mg-doped layers are transformed to P-type. Thereafter, a P-side electrode 9 is formed on the P-type GaN contact layer 8, and an N-side electrode 10 is formed on the exposed surface of the N-type GaN layer 2 (see FIG. 5H). In the above-described manner, the gallium nitride group compound semiconductor laser having the cross-sectional structure shown in FIG. 4 is completed.

As in the case of Examples 1 and 2, the gallium nitride group compound semiconductor laser of Example 3 also includes the surface protecting layer on the exposed surface of the cladding layer having a projection. Therefore, the gallium nitride group compound semiconductor laser having the same effects as those of Examples 1 and 2 can be realized.

Example 4

FIGS. 6A to 6H show the production steps of a gallium nitride group compound semiconductor light-emitting device according to Example 4 of the present invention. In Example 4, the present invention is applied to a gallium nitride group compound semiconductor laser, as in the case of the above-mentioned examples. In the gallium nitride group compound semiconductor laser of Example 4, a sapphire substrate 1' is used as a substrate, as in the case of Example 3. In Example 4, an N-side electrode 10 is formed on an N-type GaN layer 88 (see FIG. 6H).

The gallium nitride group compound semiconductor laser of Example 4 is also produced by an MOCVD method. Regarding a group V material, group III materials, a P-type impurity element, an N-type impurity element and carrier gases, the same materials as those in each of the above-described examples are used in Example 4.

Hereinafter, the production steps of the gallium nitride group compound semiconductor laser of Example 4 of the present invention will be described with reference to FIGS. 6A to 6H.

First of all, in order to perform a first crystal growth, a sapphire substrate 1' is placed on a susceptor of an MOCVD apparatus. Then, the substrate temperature is raised to about 1200° C. and surface treatment is conducted. Thereafter, the substrate temperature of the sapphire substrate 1' is lowered to a temperature between about 400° C. and about 650° C. Then, an $Al_{0.05}Ga_{0.95}N$ buffer layer 2' with a thickness of about 20 nm to about 100 nm is grown on the sapphire substrate 1'.

Next, the substrate temperature is raised to about 1050° C., and an Mg-doped GaN layer 22 with a thickness of about 0.5 $\mu$m to about 4 $\mu$m is grown on the buffer layer 2'. Thereafter, an Mg-doped $Al_{0.1}Ga_{0.9}N$ cladding layer 33 with a thickness of about 0.1 $\mu$m to about 0.3 $\mu$m is formed on the Mg-doped GaN layer 22.

Then, the substrate temperature is lowered to about 800° C. to about 850° C., and an non-doped $In_{0.32}Ga_{0.68}N$ active layer 4 with a thickness of about 3 nm to about 80 nm is grown on the cladding layer 33. Next, the substrate temperature is raised to about 1050° C., and an N-type $Al_{0.1}Ga_{0.9}N$ cladding layer 55 with a thickness of about 0.1 $\mu$m to about 0.3 $\mu$m is grown on the active layer 4. Then, a highly-doped N-type $Al_{0.05}Ga_{0.95}N$ layer 60' with a thickness of about 50 nm to about 200 nm is formed on the cladding layer 55 (see FIG. 6A).

Thereafter, the resultant wafer is removed from the growth chamber in the MOCVD apparatus. Thereafter, an insulation film 13 of, for example, $SiO_x$ or $SiN_x$ is formed on the highly doped N-type $Al_{0.05}Ga_{0.95}N$ layer 60'. Then, using a common photolithography technique, a part of the insulation film 13 on the highly-doped N-type $Al_{0.05}Ga_{0.95}N$ layer 60' is removed so as to form a stripe-shape 14 (see FIG. 6B).

Then, the wafer is treated with wet etching or dry etching. Thus, the highly-doped N-type $Al_{0.05}Ga_{0.95}N$ layer 60' and the N-type $Al_{0.1}Ga_{0.9}N$ cladding layer 55 are partially etched away so as to form a stripe-shaped projection 14 (see FIG. 6C).

This etching is conducted so that the width W of the stripe-shaped projection is in the range from about 2 $\mu$m to about 4 $\mu$m, and that the distance t between a current blocking layer 77, which will be described later, and the active layer 4 is about 0.1 $\mu$m.

Next, the wafer is again placed on the susceptor of the MOCVD apparatus for a second crystal growth.

In this growth step, an Mg-doped $Al_{0.05}Ga_{0.95}N$ surface protecting layer 66 is first grown at a substrate temperature of about 400° C. to about 650° C. so as to have a thickness of about 20 nm to about 100 nm. Then, the substrate temperature is raised to about 1050° C., and an Mg-doped $Al_{0.15}Ga_{0.85}N$ current blocking layer 77 is selectively grown so as to have a thickness of about 0.5 $\mu$m to about 1 $\mu$m (see FIG. 6D).

Prior to the step of applying the current blocking layer 77, the surface protecting layer 66 formed at a low substrate temperature is in a polycrystalline state. However, during the step of raising the substrate temperature to cause regrowth of the current blocking layer 77 on the surface of the surface protecting layer 66, the surface protecting layer 66 transforms from the polycrystalline state to the single crystalline state, as in the above-described examples. Thus, there are no significant adverse effects on the crystallinity of the current blocking layer 77.

Figure 6A:
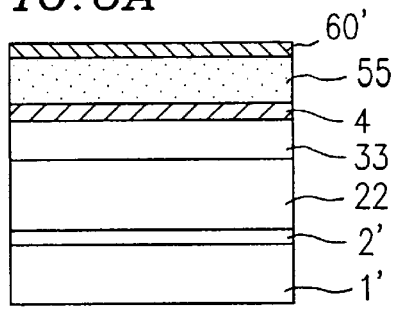
FIGS. 6A through 6H are diagrams illustrating production steps of the gallium nitride group compound semiconductor laser according to Example 4 of the present invention.
Figure 6E:
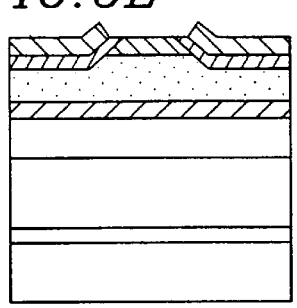
Figure 6B:
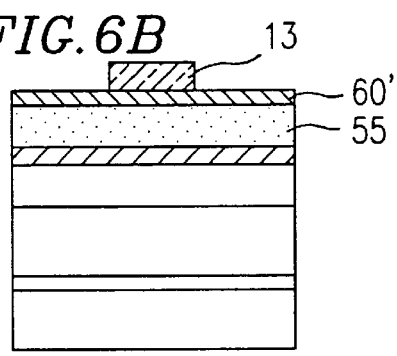

Then, the wafer is removed from the growth chamber of the MOCVD apparatus, and the insulation film 13 is etched away by a hydrofluoric acid etching solution (see FIG. 6E).

Thereafter, the wafer is again placed on the susceptor of the MOCVD apparatus for a third crystal growth.

Figure 6F:
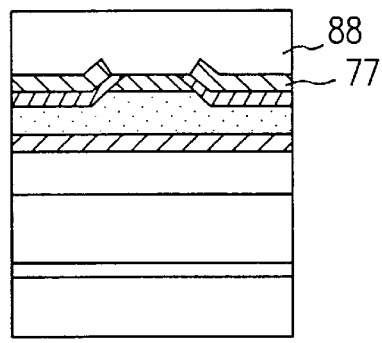
Figure 6C:
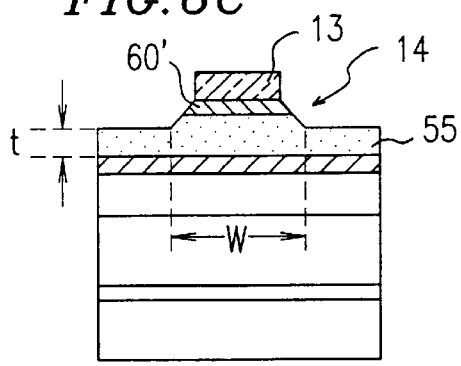

In this growth step, the substrate temperature is raised to about 1050° C., and an N-type GaN contact layer 88 is grown so as to have a thickness of about 0.5 $\mu$m to about 1 $\mu$m (see FIG. 6F).

Figure 6G:
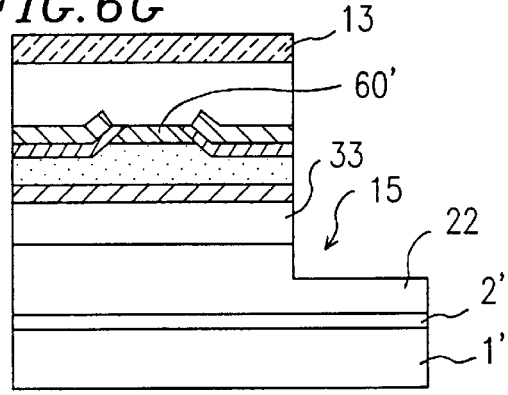
Figure 6D:
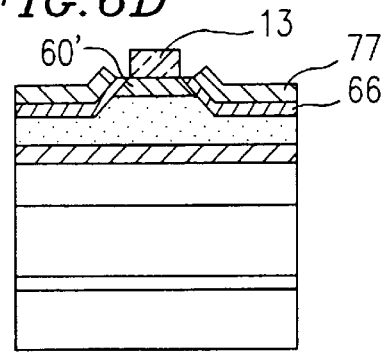
Figure 6H:
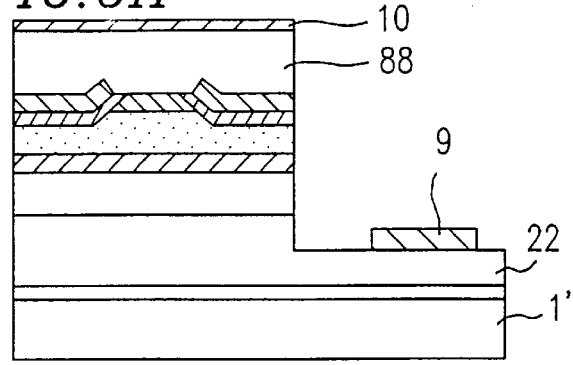
Figure 7:
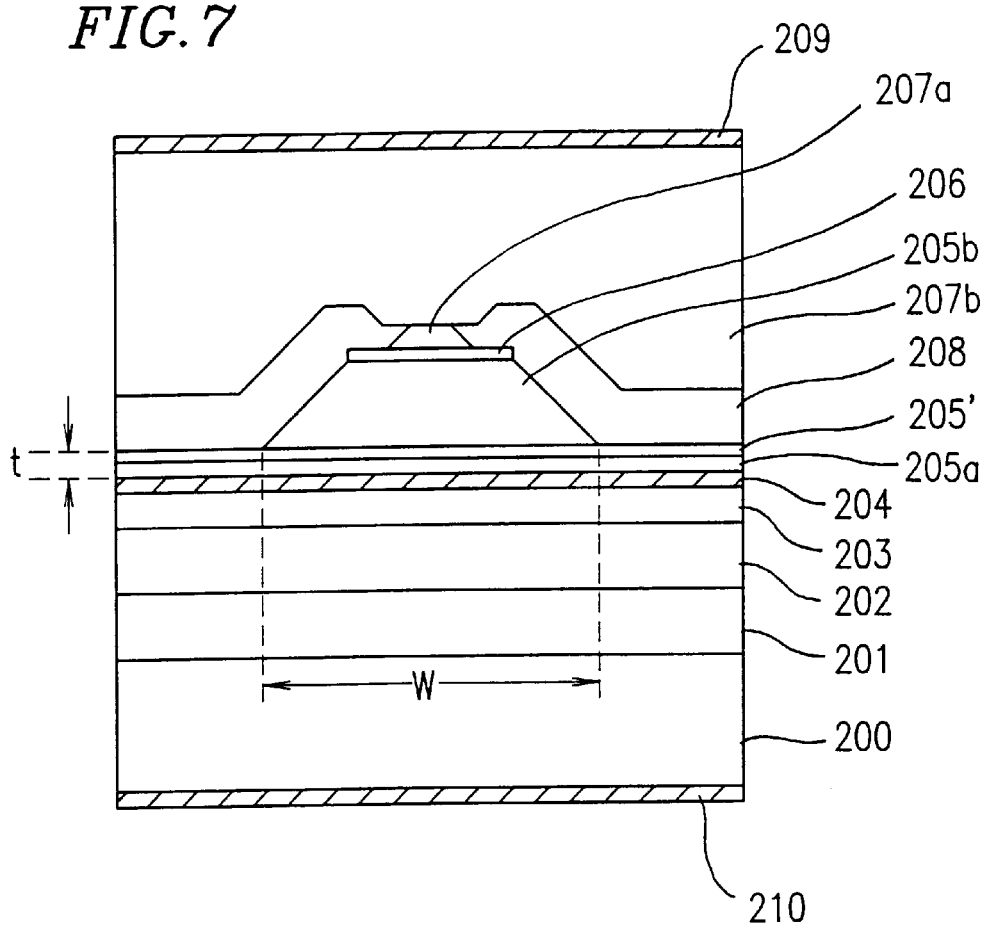
FIG. 7 is a cross sectional view showing a conventional InGaAlP group compound semiconductor laser.

Then, the wafer is removed from the MOCVD apparatus, and is etched until the Mg-doped GaN layer 22 is exposed, as shown by the reference numeral 15 in FIG. 6G.

Thereafter, the wafer is removed from the MOCVD apparatus. In a $N_2$ atmosphere, the wafer is annealed at a temperature of about 800° C. so that the Mg-doped layers are transformed to P-type. Then, an N-side electrode 10 is formed on the N-type GaN contact layer 88, and a P-side electrode 9 is formed on the exposed surface of the Mg-doped GaN layer 22. In the above-described manner, the gallium nitride group compound semiconductor laser according to Example 4 is completed.

As in the case of Examples 1 and 2, the gallium nitride group compound semiconductor laser of Example 4 also includes the surface protecting layer formed on the exposed surface of the cladding layer. Therefore, the gallium nitride group compound semiconductor laser having the same effects as those of Examples 1 and 2 can be realized.

It should be noted that, although the present invention is applied to a gallium nitride group compound semiconductor laser in each of the above-described examples, the present invention may be applied to a gallium nitride group compound light-emitting diode.

According to the present invention, the surface protecting layer is formed at a low substrate temperature on the exposed surface of the cladding layer having a projection. Thereafter, the substrate temperature is raised, and the current blocking layer is formed. Therefore, evaporation of Ga, N or impurity elements from the exposed surface of the cladding layer can be prevented. As a result, the surface roughness at the exposed surface of the cladding layer will not occur. Moreover, the width W of the stripe-shaped projection as well as the distance t between the current blocking layer and the active layer will not change.

Accordingly, a highly-reliable gallium nitride group semiconductor light-emitting device such as a gallium nitride group semiconductor laser and a light-emitting diode, which has a high-quality regrowth interface as well as having excellent electrical and optical characteristics, can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride group compound semiconductor light-emitting device comprising a layered structure on a substrate, the layered structure including:
   an active layer,
   a first cladding layer and a second cladding layer with the active layer interposed therebetween, the second cladding layer being located further away from the substrate than the first cladding layer, and having a stripe-shaped projection, and
   a surface protecting layer and an internal current blocking layer which are formed on the second cladding layer and have an opening at a position corresponding to a position on the stripe-shaped projection,
   wherein the surface protecting layer serves to prevent evaporation of Ga, N or impurity elements from the second cladding layer in a process including forming the internal current blocking layer.

2. A gallium nitride group compound semiconductor light-emitting device according to claim 1, wherein, the substrate is conductive or non-conductive, i.e., not a semiconductor, the surface protecting layer is made of $Al_zGa_{1-z}N$ (where $0 \leq z \leq 1$), and the layered structure is made of $Ga_sAl_tIn_{1-s-t}N$ (where $0 < s \leq 1$, $0 \leq t < 1$, and $0 < s+t \leq 1$).

3. A gallium nitride group compound semiconductor light-emitting device according to claim 1, wherein the substrate, the first cladding layer, the surface protecting layer and the current blocking layer are of a first conductivity type, the second cladding layer is of a second conductivity type, and the layered structure further includes:
a buffer layer of the first conductivity type formed on the substrate, and
a contact layer of the second conductivity type formed on the internal current blocking layer of the first conductivity type.

4. A gallium nitride group compound semiconductor light-emitting device according to claim 1, wherein the substrate is non-conductive, the first cladding layer, the surface protecting layer and the internal current blocking layer are of a first conductivity type, the second cladding layer is of a second conductivity type, and the layered structure further includes:
a first buffer layer and a second buffer layer which are formed on the substrate, the second buffer layer being of the first conductivity type, and
a contact layer of the second conductivity type formed on the internal current blocking layer of the first conductivity type.

5. A gallium nitride group compound semiconductor light-emitting device according to claim 1, wherein the surface protecting layer is formed at a temperature in a range from about 400° C. to about 650° C.

6. A gallium nitride group compound semiconductor light-emitting device according to claim 1, wherein a layer of a highly-doped material selected from the group consisting of AlGaN and InAlGaN is formed on the top of the stripe-shaped projection of the second cladding layer.

7. A gallium nitride group compound semiconductor light-emitting device comprising a layered structure on a substrate, the layered structure including:

an active layer;

a first cladding layer and a second cladding layer with the active layer interposed therebetween, the second cladding layer being located further away from the substrate than the first cladding layer, and having a stripe-shaped projection; and a surface protecting layer and an internal current blocking layer which are formed on the second cladding layer and have an opening at a position corresponding to a position on the stripe-shaped projection, and a contact layer formed on both the internal current blocking layer and an exposed surface of the stripe-shaped projection at the opening, wherein the surface protecting layer serves to prevent evaporation of Ga, N or impurity elements from the second cladding layer in a process including forming the internal current blocking layer.

8. A gallium nitride group compound semiconductor light-emitting device according to claim 7, wherein, the substrate is conductive or non-conductive, i.e., not a semiconductor, the surface protecting layer is made of $Al_zGa_{1-z}N$ (where $0 \leq z \leq 1$), and the layered structure is made of $Ga_sAl_tIn_{1-s-t}N$ (where $0 < s \leq 1$, $0 \leq t < 1$, and $0 < s+t \leq 1$).

9. A gallium nitride group compound semiconductor light-emitting device according to claim 7, wherein the substrate, the first cladding layer, the surface protecting layer and the current blocking layer are of a first conductivity type, the second cladding layer is of a second conductivity type, and the layered structure further includes:
a buffer layer of the first conductivity type formed on the substrate.

10. A gallium nitride group compound semiconductor light-emitting device according to claim 7, wherein the substrate is non-conductive, the first cladding layer, the surface protecting layer and the internal current blocking layer are of a first conductivity type, the second cladding layer is of a second conductivity type, and the layered structure further includes:
a first buffer layer and a second buffer layer which are formed on the substrate, the second buffer layer being of the first conductivity type.

11. A gallium nitride group compound semiconductor light-emitting device according to claim 7, wherein the surface protecting layer is formed at a temperature in a range from about 400° C. to about 650° C.

12. A gallium nitride group compound semiconductor light-emitting device according to claim 6, wherein the substrate is conductive or non-conductive, i.e., not a semiconductor, the surface protecting layer is made of $Al_zGa_{1-z}N$ (where $0 \leq z \leq 1$), and the layered structure is made of $Ga_sAl_tIn_{1-s-t}N$ (where $0 < s \leq 1$, $0 \leq t < 1$, and $0 < s+t \leq 1$).

13. A gallium nitride group compound semiconductor light-emitting device according to claim 6, wherein the substrate, the first cladding layer, the surface protecting layer and the current blocking layer are of a first conductivity type, the second cladding layer is of a second conductivity type, and the layered structure further includes:
a buffer layer of the first conductivity type formed on the substrate, and
a contact layer of the second conductivity type formed on the internal current blocking layer of the first conductivity type.

14. A gallium nitride group compound semiconductor light-emitting device according to claim 6, wherein the substrate is non-conductive, the first cladding layer, the surface protecting layer and the internal current blocking layer are of a first conductivity type, the second cladding layer is of a second conductivity type, and the layered structure further includes:
   a first buffer layer and a second buffer layer which are formed on the substrate, the second buffer layer being of the first conductivity type, and
   a contact layer of the second conductivity type formed on the internal current blocking layer of the first conductivity type.

15. A gallium nitride group compound semiconductor light-emitting device according to claim 6, wherein
   the surface protecting layer is formed at a temperature in a range from about 400° C. to about 650° C.

* * * * *